(12) United States Patent
Feng et al.

(10) Patent No.: US 12,453,234 B2
(45) Date of Patent: Oct. 21, 2025

(54) BLUE TOP EMITTING QUANTUM DOT LIGHT-EMITTING DEVICE AND DISPLAY APPARATUS

(71) Applicants: Beijing BOE Technology Development Co., Ltd., Beijing (CN); BOE Technology Group Co., Ltd., Beijing (CN)

(72) Inventors: Jingwen Feng, Beijing (CN); Maocheng Jiang, Beijing (CN); Yichi Zhang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/028,462

(22) PCT Filed: Jun. 21, 2022

(86) PCT No.: PCT/CN2022/100193
§ 371 (c)(1),
(2) Date: Mar. 24, 2023

(87) PCT Pub. No.: WO2023/245436
PCT Pub. Date: Dec. 28, 2023

(65) Prior Publication Data
US 2025/0120245 A1     Apr. 10, 2025

(51) Int. Cl.
*H10K 50/115*     (2023.01)
*C09K 11/88*      (2006.01)
*H10K 50/15*      (2023.01)
*B82Y 20/00*      (2011.01)
*H10K 102/00*     (2023.01)

(52) U.S. Cl.
CPC .......... *H10K 50/115* (2023.02); *C09K 11/883* (2013.01); *H10K 50/15* (2023.02); *B82Y 20/00* (2013.01); *H10K 2102/3026* (2023.02); *H10K 2102/351* (2023.02)

(58) Field of Classification Search
None
See application file for complete search history.

(56) References Cited

U.S. PATENT DOCUMENTS

2020/0362240 A1\* 11/2020 Yang ............... H10K 50/115

\* cited by examiner

*Primary Examiner* — Anthony Ho
(74) *Attorney, Agent, or Firm* — IPro, PLLC

(57) ABSTRACT

A blue top emitting quantum dot light-emitting device and a display apparatus are disclosed. The blue top emitting quantum dot light-emitting device includes: a cathode and an anode oppositely arranged, a blue quantum dot light-emitting layer between the cathode and the anode, an electron transport layer between the cathode and the blue quantum dot light-emitting layer, and a hole transport layer between the blue quantum dot light-emitting layer and the anode; where: a material of the blue quantum dot light-emitting layer is $ZnSe_{1-x}:Te_x/ZnSe/ZnS$, $ZnSe_{1-x}:Te_x$ means that a molar ratio of Se to Te is 1-$x$:$x$, and $x$ is 0.03 to 0.07; a thickness of the hole transport layer is 10 nm to 35 nm, a thickness of the electron transport layer is 25 nm to 50 nm, and a sum of thicknesses of the hole transport layer and the electron transport layer is 55 nm to 65 nm.

20 Claims, 8 Drawing Sheets

| Light extraction layer | — 7 |
| Cathode | — 1 |
| Electron transport layer | — 4 |
| Blue quantum dot light-emitting layer | — 3 |
| Hole transport layer | — 5 |
| Hole injection layer | — 6 |
| Anode | — 2 |
| Substrate | — 8 |

| Light extraction layer | — 7 |
| Cathode | — 1 |
| Electron transport layer | — 4 |
| Blue quantum dot light-emitting layer | — 3 |
| Hole transport layer | — 5 |
| Hole injection layer | — 6 |
| Anode | — 2 |
| Substrate | — 8 |

BLUE TOP EMITTING QUANTUM DOT LIGHT-EMITTING DEVICE AND DISPLAY APPARATUS

This application is a National Stage of International Application No. PCT/CN2022/100193, filed on Jun. 21, 2022, which is hereby incorporated by reference in its entirety.

FIELD

The disclosure relates to the field of display technology, and particularly to a blue top emitting quantum dot light-emitting device and a display apparatus.

BACKGROUND

Quantum Dot (QD for short), as a new type of luminescent material, has advantages of high light color purity, high luminous quantum efficiency, adjustable luminous color and long service life, and has become a research hotspot of luminescent materials in the current novel light emitting diodes. Therefore, the Quantum Dot Light Emitting Diode (QLED for short) in which a quantum dot material is used as a light-emitting layer has become the main research direction of the current novel display devices.

SUMMARY

An embodiment of the disclosure provides a blue top emitting quantum dot light-emitting device and a display apparatus, and the specific scheme is as follows.

An embodiment of the disclosure further provides a blue top emitting quantum dot light-emitting device, including: a cathode and an anode oppositely arranged, a blue quantum dot light-emitting layer between the cathode and the anode, an electron transport layer between the cathode and the blue quantum dot light-emitting layer, and a hole transport layer between the blue quantum dot light-emitting layer and the anode; where:
- a material of the blue quantum dot light-emitting layer is $ZnSe_{1-x}:Te_x/ZnSe/ZnS$, where $ZnSe_{1-x}:Te_x$ means that a molar ratio of Se to Te is $1-x:x$, and x is 0.03 to 0.07;
- a thickness of the hole transport layer is 10 nm to 35 nm, a thickness of the electron transport layer is 25 nm to 50 nm, and a sum of thicknesses of the hole transport layer and the electron transport layer is 55 nm to 65 nm.

In a possible implementation, in the above-mentioned blue top emitting quantum dot light-emitting device provided by an embodiment of the disclosure, x=0.03 to 0.04, and the thickness of the hole transport layer is less than the thickness of the electron transport layer.

In a possible implementation, in the above-mentioned blue top emitting quantum dot light-emitting device provided by an embodiment of the disclosure, a luminescence peak of a photoluminescence spectrum corresponding to a maximum luminous intensity of the blue quantum dot light-emitting layer is 455 nm, and a luminescence peak of an electroluminescence spectrum corresponding to a maximum luminous intensity of the blue top emitting quantum dot light-emitting device is 460 nm.

In a possible implementation, in the above-mentioned blue top emitting quantum dot light-emitting device provided by an embodiment of the disclosure, the thickness of the hole transport layer is 10 nm, and the thickness of the electron transport layer is 48 nm.

In a possible implementation, in the above-mentioned blue top emitting quantum dot light-emitting device provided by an embodiment of the disclosure, the thickness of the hole transport layer is 25 nm, and the thickness of the electron transport layer is 35 nm.

In a possible implementation, the above-mentioned blue top emitting quantum dot light-emitting device provided by an embodiment of the disclosure further includes a hole injection layer between the hole transport layer and the anode, where a distance between the cathode and the anode is 90 nm to 100 nm.

In a possible implementation, in the above-mentioned blue top emitting quantum dot light-emitting device provided by an embodiment of the disclosure, the blue quantum dot light-emitting layer has a valence band position of −6.8 eV to −6.9 eV and a conduction band position of −3.8 eV to −3.9 eV.

In a possible implementation, in the above-mentioned blue top emitting quantum dot light-emitting device provided by an embodiment of the disclosure, x=0.05 to 0.06, a luminescence peak of a photoluminescence spectrum corresponding to a maximum luminous intensity of the blue quantum dot light-emitting layer is 460 nm, and a luminescence peak of an electroluminescence spectrum corresponding to a maximum luminous intensity of the blue top emitting quantum dot light-emitting device is 475 nm.

In a possible implementation, the above-mentioned blue top emitting quantum dot light-emitting device provided by an embodiment of the disclosure further includes a hole injection layer between the hole transport layer and the anode, where a distance between the cathode and the anode is 95 nm to 105 nm.

In a possible implementation, in the above-mentioned blue top emitting quantum dot light-emitting device provided by an embodiment of the disclosure, the blue quantum dot light-emitting layer has a valence band position of −6.5 eV to −6.6 eV and a conduction band position of −3.7 eV to −3.8 eV.

In a possible implementation, in the above-mentioned blue top emitting quantum dot light-emitting device provided by an embodiment of the disclosure, x=0.06 to 0.07, a luminescence peak of a photoluminescence spectrum corresponding to a maximum luminous intensity of the blue quantum dot light-emitting layer is 470 nm, and a luminescence peak of an electroluminescence spectrum corresponding to a maximum luminous intensity of the blue top emitting quantum dot light-emitting device is 485 nm.

In a possible implementation, the above-mentioned blue top emitting quantum dot light-emitting device provided by an embodiment of the disclosure further includes a hole injection layer between the hole transport layer and the anode, where a distance between the cathode and the anode is 95 nm to 110 nm.

In a possible implementation, in the above-mentioned blue top emitting quantum dot light-emitting device provided by an embodiment of the disclosure, the blue quantum dot light-emitting layer has a valence band position of −6.4 eV to −6.5 eV and a conduction band position of −3.6 eV to −3.7 eV.

In a possible implementation, in the above-mentioned blue top emitting quantum dot light-emitting device provided by an embodiment of the disclosure, a thickness of the hole injection layer is 20 nm to 24 nm, and a thickness of the blue quantum dot light-emitting layer is 8 nm to 12 nm.

In a possible implementation, in the above-mentioned blue top emitting quantum dot light-emitting device provided by an embodiment of the disclosure, the thickness of the hole injection layer is 22 nm, and the thickness of the blue quantum dot light-emitting layer is 10 nm.

In a possible implementation, in the above-mentioned blue top emitting quantum dot light-emitting device provided by an embodiment of the disclosure, the hole transport layer has a valence band position of −5.8 eV and a conduction band position of −2.9 eV; and the electron transport layer has a valence band position of −7.36 eV and a conduction band position of −3.86 eV.

In a possible implementation, in the above-mentioned blue top emitting quantum dot light-emitting device provided by an embodiment of the disclosure, the anode includes a transparent conductive layer, a metal layer and a transparent conductive layer stacked, a material of the metal layer includes Ag, a thickness of the metal layer is 80 nm to 120 nm, a material of the transparent conductive layer includes indium tin oxide, and a thickness of the transparent conductive layer is 8 nm to 12 nm.

In a possible implementation, in the above-mentioned blue top emitting quantum dot light-emitting device provided by an embodiment of the disclosure, a material of the cathode includes Mg/Ag alloy, and a thickness of the cathode is 8 nm to 12 nm.

In a possible implementation, in the above-mentioned blue top emitting quantum dot light-emitting device provided by an embodiment of the disclosure, the blue top emitting quantum dot light-emitting device is an upright structure.

An embodiment of the disclosure further provides a display apparatus, including a red quantum dot light-emitting device, a green quantum dot light-emitting device, and a blue top emitting quantum dot light-emitting device which is the blue top emitting quantum dot light-emitting device described in any one of the above implementations provided by embodiments of the disclosure.

DETAILED DESCRIPTION OF EMBODIMENTS

Figures 1, 2A:
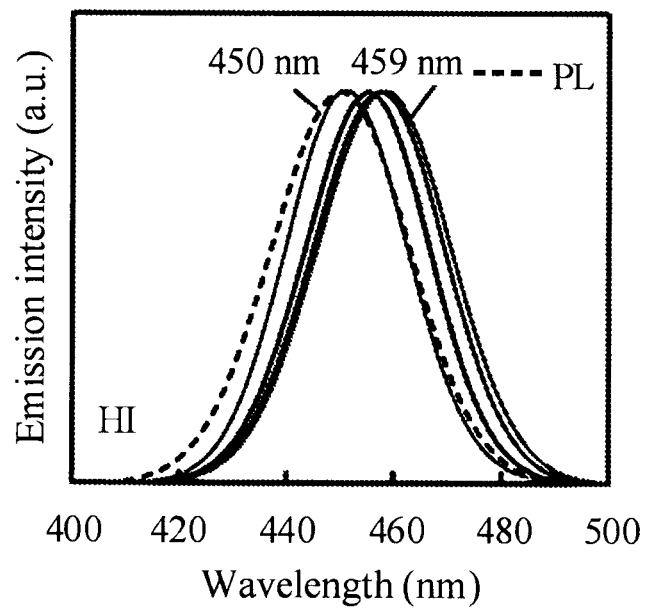
FIG. 1 is a schematic structural diagram of a blue top emitting quantum dot light-emitting device according to an embodiment of the disclosure.
FIGS. 2A-2D are several schematic diagrams of simulating the EL emission spectrum of the blue QLED device respectively.

In order to make purposes, technical solutions and advantages of the disclosure clearer, the technical solutions of embodiments of the disclosure will be described clearly and completely below in combination with the accompanying drawings of embodiments of the disclosure. Obviously the described embodiments are a part of embodiments of the disclosure but not all embodiments. Also in the case of no conflict, embodiments and the features therein in the disclosure can be combined with each other. Based upon embodiments of the disclosure, all of other embodiments obtained by those ordinary skilled in the art without creative work pertain to the protection scope of the disclosure.

Unless otherwise defined, the technical or scientific terms used in the disclosure shall have the general meaning understood by those ordinary skilled in the art to which the disclosure belongs. The word such as "include" or "comprise" or the like used in the disclosure means that the element or object appearing before this word encompasses the elements or objects and their equivalents listed after this word, without excluding other elements or objects. The word such as "connect" or "connected" or the like is not limited to the physical or mechanical connection, but can include the electrical connection, whether direct or indirect. The words such as "inner", "outer", "up", "down" are only used to represent the relative position relationship. When the absolute position of a described object changes, the relative position relationship may also change accordingly.

It should be noted that the size and shape of each diagram in the accompanying drawings do not reflect the true proportion, and are merely for purpose of schematically illustrating the content of the disclosure. Also, the same or similar reference numbers represent the same or similar elements or the elements having the same or similar functions all the way.

At present, the active electro-quantum dot light-emitting display product (AMQLED) has also received more and more attention due to potential advantages such as wide color gamut and long service life. The research on such product is deepened day by day, and the quantum efficiency is improved unceasingly, basically reaching the level of industrialization. The further use of new processes and technologies to achieve the industrialization has become a future trend.

According to different light emitting modes, QLED devices may be divided into Bottom Emitting QLED devices (BE-QLEDs) and Top Emitting QLED devices (TE- QLEDs). For a bottom emitting QLED device, the anode is transparent ITO, the cathode is reflective metal, and light generated by electroluminescence may pass through the transparent anode and be emitted from the bottom of the device. The top emitting QLED device is different from the structure of the bottom emitting QLED device. The anode of the top emitting QLED device is a reflective structure, the cathode of the top emitting QLED device is a semi-transparent and semi-reflective structure, and the light generated by electroluminescence is emitted from the device through the semi-transparent and semi-reflective cathode. In the manufacturing process of the AMQLED, the QLED device is generally evaporated onto a Thin-Film Transistor (TFT) array due to the limitation of the manufacturing process. If the structure of the bottom emitting QLED device is used in the AMQLED, the light generated by electroluminescence needs to pass through the anode, TFT array and substrate before the light can be emitted into the air. Due to the influence of the TFT array and the underlying substrate, a part of the light will be blocked and cannot be emitted into the air, and the aperture ratio of the device is reduced, affecting the display effect seriously. For the top emitting QLED device, the light emitting direction is the direction of the cathode and is the opposite direction to the TFT array and substrate, etc., so that the influence of the TFT array and substrate, etc. can be avoided, the aperture ratio is relatively large, and the higher display effect is easily achieved. Thus, the top emitting device is more suitable for the high-resolution display.

However, in the QLED device structure, due to the quantum dot material itself, the luminous efficiency of the blue top emitting quantum dot light-emitting device is weaker than the luminous efficiency of the red quantum dot light-emitting device and green quantum dot light-emitting device. Therefore, it is very necessary to improve the luminous efficiency of the blue top emitting quantum dot light-emitting device to improve the efficiency of the overall device structure of the QLED.

In the blue top emitting quantum dot light-emitting device (abbreviated as blue QLED), the optical microcavity effect (the microcavity formed between the cathode and the anode) has a significant impact on the spectrum, which generally causes the electroluminescence (EL) spectrum of the blue QLED to be broadened and red-shifted compared with the photoluminescence (PL) spectrum of the blue quantum dot material, so that the CIEy coordinate value of the blue QLED becomes larger, resulting in a reduction in the color gamut when applied to a full-color device. Therefore, it is necessary to reasonably design the device structure of the blue QLED to achieve lower CIEy value. In the display industry, the ratio of current efficiency to CIEy is an important parameter for evaluating the blue QLED. For a full-color display, the high current efficiency and low CIEy value of the blue QLED means that less blue light components are needed to achieve the white balance condition, thereby reducing the power consumption of the panel. Therefore, the ratio of current efficiency to CIEy is generally used to evaluate the performance of the blue QLED. This value is defined as chromaticity efficiency. The higher the chromaticity efficiency, the better the device performance of the blue QLED.

In order to improve the chromaticity efficiency of the blue QLED, an embodiment of the disclosure provides a blue top emitting quantum dot light-emitting device, as shown in FIG. 1, including: a cathode 1 and an anode 2 oppositely arranged, a blue quantum dot light-emitting layer 3 between the cathode 1 and the anode 2, an electron transport layer 4 between the cathode 1 and the blue quantum dot light-emitting layer 3, and a hole transport layer 5 between the blue quantum dot light-emitting layer 3 and the anode 2.

A material of the blue quantum dot light-emitting layer 3 is $ZnSe_{1-x}:Te_x/ZnSe/ZnS$, where $ZnSe_{1-x}:Te$, means that a molar ratio of Se to Te is 1-x:x, and x is 0.03 to 0.07.

A thickness of the hole transport layer 5 is 10 nm to 35 nm, a thickness of the electron transport layer 4 is 25 nm to 50 nm, and a sum of thicknesses of the hole transport layer 5 and the electron transport layer 4 is 55 nm to 65 nm.

In the above-mentioned blue top emitting quantum dot light-emitting device provided by an embodiment of the disclosure, Te (tellurium) with molar content of 0.03 to 0.07 is doped in ZnSe (core) of the blue quantum dot material made of ZnSe/ZnSe/ZnS (core/shell/shell), and the thickness of the hole transport layer is set to 10 nm to 35 nm, the thickness of the electron transport layer is set to 25 nm to 50 nm, and the sum of the thicknesses of the hole transport layer and the electron transport layer is set to 55 nm to 65 nm, so that the optical performance and electrical performance of the blue top emitting quantum dot light-emitting device can be optimal, and the finally obtained chromaticity efficiency of the blue top emitting quantum dot light-emitting device can reach 72.5, improving the device performance of the blue top emitting quantum dot light-emitting device effectively.

As outlined above, in the blue top emitting quantum dot light-emitting device (abbreviated as blue QLED), the optical microcavity effect (the microcavity formed between the cathode and the anode) has a significant impact on the spectrum, which generally causes the electroluminescence (EL) spectrum of the blue QLED to be broadened and red-shifted compared with the photoluminescence (PL) spectrum of the blue quantum dot material, so that the CIEy coordinate value of the blue QLED becomes larger, resulting in a reduction in the color gamut when applied to a full-color device. The reason why the EL spectrum of the blue QLED is red-shifted compared with the PL spectrum of the blue quantum dot material is explained as follows.

Taking the top emitting blue QLED device as an example, the light generated by electroluminescence is reflected, scattered and diffracted multiple times at a plurality of organic film layers (such as the electron transport layer, hole transport layer, quantum dot light-emitting layer, etc.) in the optical microcavity and metal film layers of electrodes (cathode and anode), which causes changes in the luminous phase, so that the light with some wavelengths is strengthened while the light with other wavelengths is suppressed, and the light selection occurs. The microcavity effect causes the emission wavelength of the device to satisfy the formula of:

$$\Sigma_i 2n_i d_i \cos\theta + \varnothing_1 + \varnothing_2 = k\lambda (k \text{ is an integer}).$$

Where $d_i$ represents a thickness of each organic film layer, $n_i$ represents a refractive index of each organic film layer, $\theta$ represents a viewing angle (an included angle formed by the light emitting direction and the vertical direction), $\varnothing_1$ and $\varnothing_2$ represent phase changes of the light caused by reflection at the cathode and the anode respectively and are related to refractive coefficients and extinction coefficients of the electrodes as well as the refractive index of the adjacent organic film layer, and k is the wavelength of the luminescence peak of the device. Therefore, for different wavelengths, the microcavity produces different effects, where the light with some wavelengths is enhanced, and the light with some wavelengths is weakened. For a blue QLED device with a luminescence peak at 450 nm to 475 nm, since the long wavelength is more compatible with the device cavity length (the distance between the cathode and the anode), generally the EL luminescence peak (the EL emission spectrum of the blue QLED device) will be red-shifted relative to the PL luminescence peak (the PL emission spectrum of the blue quantum dot material itself) after the blue quantum dot material is applied to the top emitting device, so that the CIEy value of the blue QLED device becomes larger.

Figure 2B:
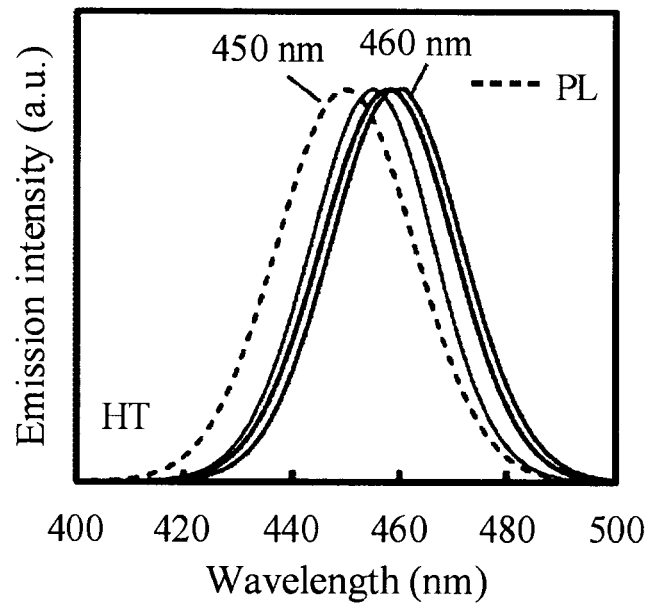
Figure 2C:
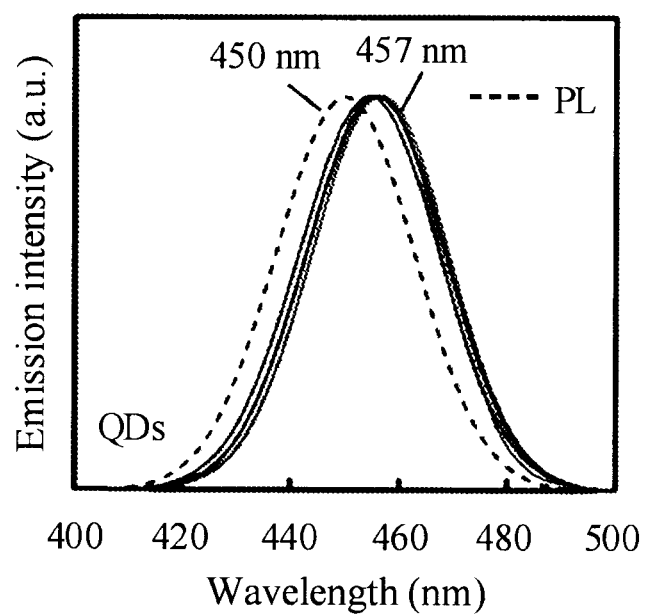
Figure 2D:
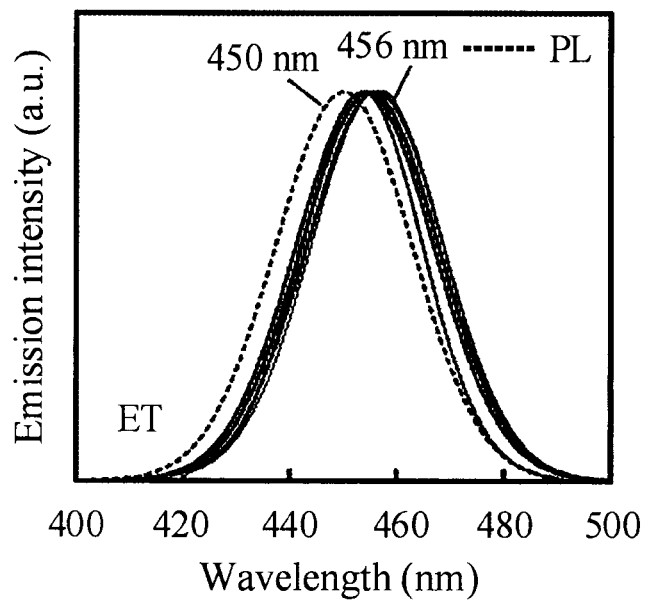

The spectrum of the standard blue quantum dot material with PL luminescence peak at 450 nm is introduced into the top emitting QLED device, and the EL emission spectrum of the blue QLED device is simulated by changing the thicknesses of the hole injection layer (represented by HI), hole transport layer (represented by HT), blue quantum dot light-emitting layer (represented by QDs) and electron transport layer (represented by ET) in the blue QLED device. The simulation results are shown in FIGS. 2A-2D. The dashed spectra in FIGS. 2A-2D are all PL emission spectra of the standard blue quantum dot material with luminescence peak at 450 nm. The solid spectra from left to right in FIG. 2A are EL emission spectra of the blue QLED device when the thickness of only the HI increases progressively; the solid spectra from left to right in FIG. 2B are EL emission spectra of the blue QLED device when the thickness of only the HT increases progressively; the solid spectra from left to right in FIG. 2C are EL emission spectra of the blue QLED device when the thickness of only the QDs increases progressively; and the solid spectra from left to right in FIG. 2D are EL emission spectra of the blue QLED device when the thickness of only the ET increases progressively. As can be seen, in the top emitting blue QLED device, the thickness variations of different functional layers (such as HI, HT, QDs, ET) affect the EL emission spectrum of the blue QLED device.

As shown in FIGS. 2A-2D, when the thickness of each functional layer (HI, HT, QDs, ET) in the top emitting blue QLED device gradually increases, the EL emission spectrum of the blue QLED device is red-shifted in different degrees relative to the PL emission spectrum of the blue quantum dot material itself, and can be red-shifted from 450 nm to 460 nm of PL at maximum (as shown in FIG. 2B, red-shifted by 10 nm). This result demonstrates that the microcavity effect of the device has a greater impact on the EL emission spectrum of the device in the structure of the top emitting blue QLED device. Therefore, the EL emission spectrum of the blue QLED device can be controlled from the perspective of adjusting the microcavity structure of the blue QLED device, so that the blue QLED device obtains a smaller CIEy value to improve the chromaticity efficiency of the blue QLED device.

Figure 3A:
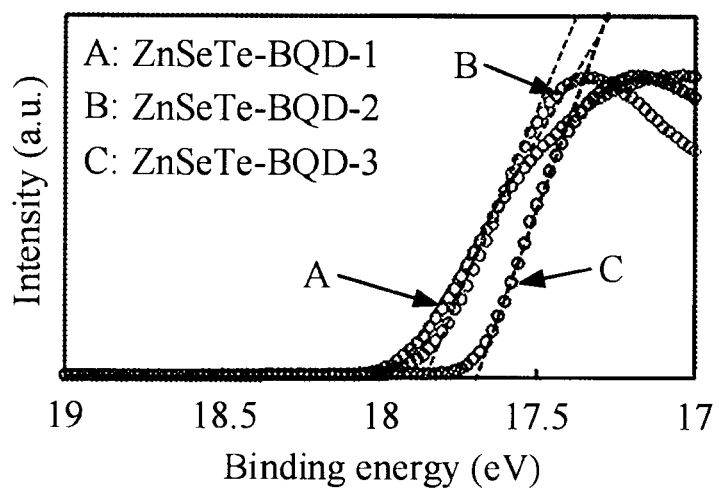
FIGS. 3A and 3B are schematic diagrams of the Binding energy of blue quantum dot light-emitting layers with three types of Te doping contents of x=0.03 to 0.04, 0.05 to 0.06 and 0.06 to 0.07.
Figure 3B:
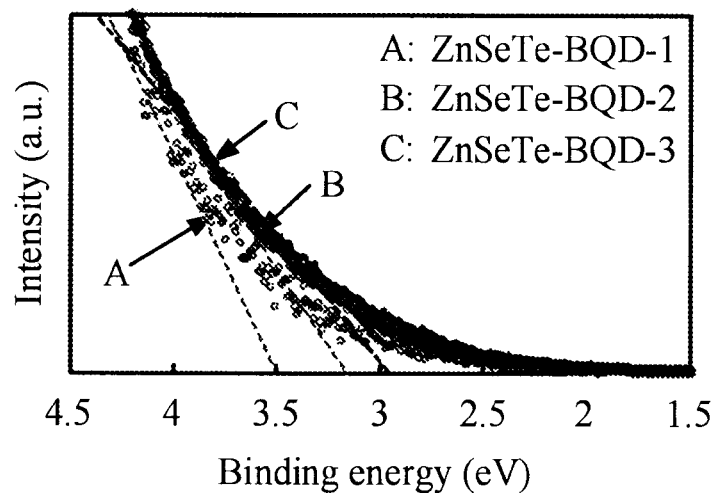
Figure 3C:
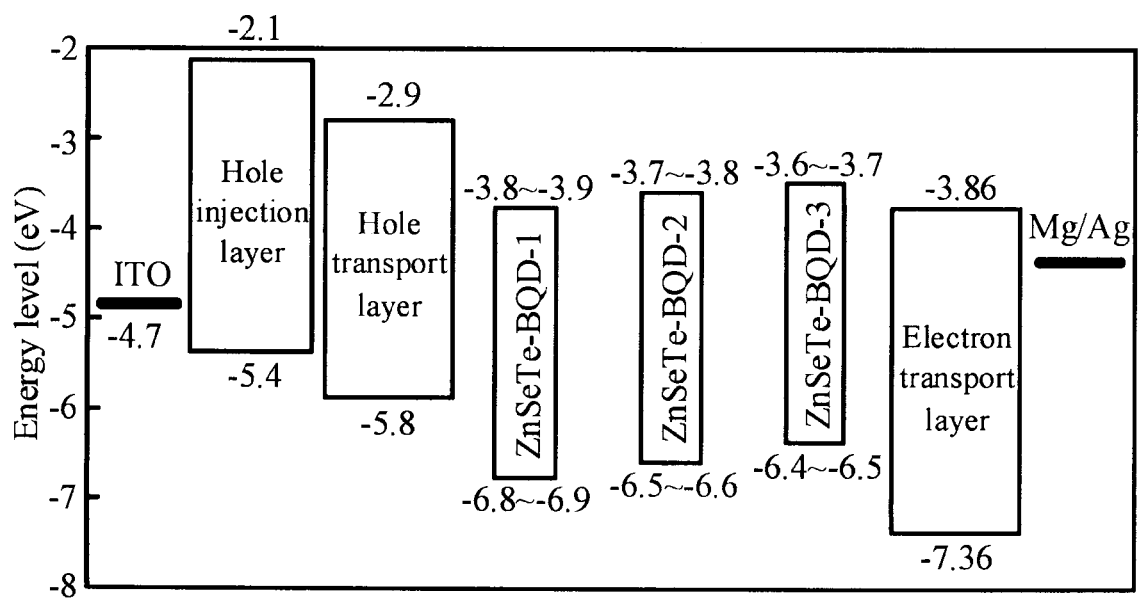
FIG. 3C is a schematic diagram of energy band positions of functional film layers in the blue top emitting quantum dot light-emitting device according to an embodiment of the disclosure.

The inventor of the disclosure tested the PL emission spectra of three types of blue quantum dot materials ($ZnSe_{1-x}:Te_x/ZnSe/ZnS$) with different Te doping content ranges respectively. When the Te doping content x is 0.03 to 0.04, the PL emission spectrum has a luminescence peak around 455 nm; when the Te doping content x is 0.05 to 0.06, the PL emission spectrum has a luminescence peak around 460 nm; when the Te doping content x is 0.06 to 0.07, the PL emission spectrum has a luminescence peak around 470 nm. The blue quantum dot materials with these three types of Te doping contents are used as blue quantum dot light-emitting layers of the top emitting blue QLED device. Due to different Te doping contents of the blue quantum dot light-emitting layers, there is also a certain difference reflected in the energy level structure of the blue quantum dot light-emitting layers, as shown in FIGS. 3A-3C. FIGS. 3A and 3B are schematic diagrams of the Binding energy of the blue quantum dot light-emitting layers 3 (represented by ZnSeTe-BQD-1, ZnSeTe-BQD-2 and ZnSeTe-BQD-3 respectively) with three Te doping contents of x=0.03 to 0.04, 0.05 to 0.06 and 0.06 to 0.07. FIG. 3C is a schematic diagram of energy band positions of functional film layers in the blue top emitting quantum dot light-emitting device according to an embodiment of the disclosure. Valence band positions and conduction band positions of three types of blue quantum dot light-emitting layers 3 with different Te doping contents in FIG. 3C are calculated according to the binding energy shown in FIGS. 3A and 3B, where the blue quantum dot light-emitting layer (represented by ZnSeTe-BQD-1) corresponding to x=0.03 to 0.04 has a valence band position of −6.8 eV to −6.9 eV and a conduction band position of −3.8 eV to −3.9 eV; the blue quantum dot light-emitting layer (represented by ZnSeTe-BQD-2) corresponding to x=0.05 to 0.06 has a valence band position of −6.5 eV to −6.6 eV and a conduction band position of −3.7 eV to −3.8 eV; and the blue quantum dot light-emitting layer (represented by ZnSeTe-BQD-3) corresponding to x=0.06 to 0.07 has a valence band position of −6.4 eV to −6.5 eV and a conduction band position of −3.6 eV to −3.7 eV. Furthermore, the hole transport layer (represented by HT) has a valence band position of −5.8 eV and a conduction band position of −2.9 eV; the hole injection layer (represented by HI) has a valence band position of −5.4 eV and a conduction band position of −2.1 eV; and the electron transport layer (represented by ET) has a valence band position of −7.36 eV and a conduction band position of −3.86 eV. As can be seen, when the Te doping content x gradually increases from 0.03 to 0.07, the forbidden band width of the blue quantum dot light-emitting layer 3 becomes smaller, so that the luminescence peak of the PL emission spectrum is red-shifted from 455 nm to 470 nm. At the same time, it can also be seen from FIG. 3C that the valence band position of the blue quantum dot light-emitting layer 3 also becomes shallower gradually, so that the energy band barrier between the blue quantum dot light-emitting layer 3 and the hole transport layer 5 is gradually reduced. This phenomenon may lead to the difference in the electrical property of the device, and is thus reflected in the difference in the luminous efficiency of the device.

Figure 4:
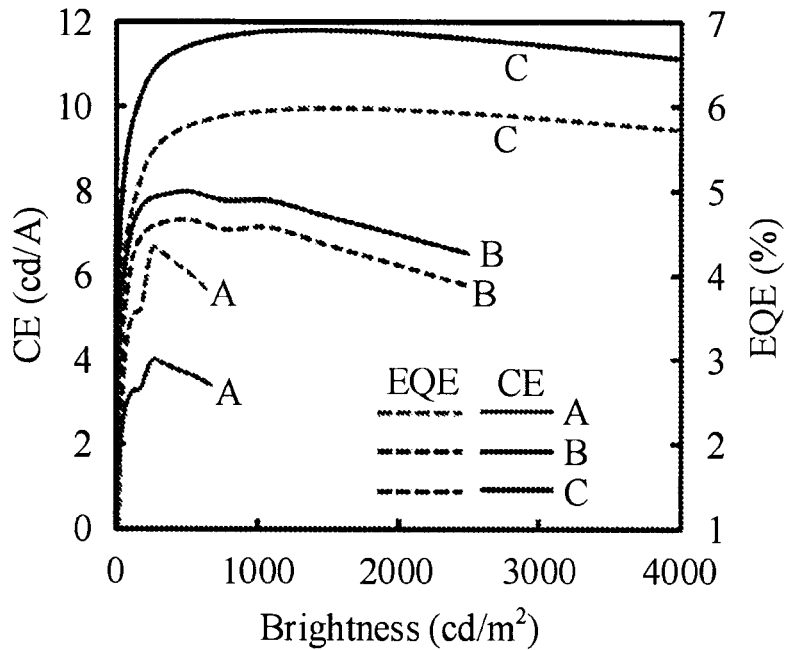
FIG. 4 is a schematic diagram of Current Efficiency (CE) and External Quantum Efficiency (EQE) of three types of top emitting blue QLED devices corresponding to blue quantum dot light-emitting layers with different Te doping contents.

As shown in FIG. 4, FIG. 4 is a schematic diagram of the Current Efficiency (CE) and External Quantum Efficiency (EQE) of three types of top emitting blue QLED devices corresponding to three types of blue quantum dot light-emitting layers with different Te doping contents (x=0.03 to 0.04, x=0.05 to 0.06, x=0.06 to 0.07). A represents the CE curve (solid line) and EQE curve (dashed line) of the blue QLED device corresponding to x=0.03 to 0.04, B represents the CE curve (solid line) and EQE curve (dashed line) of the blue QLED device corresponding to x=0.05 to 0.06, and C represents the CE curve (solid line) and EQE curve (dashed line) of the blue QLED device corresponding to x=0.06 to 0.07. Before the chrominance efficiencies of the blue QLED devices are optimized, three types of top emitting blue QLED devices corresponding to three types of blue quantum dot light-emitting layers with different Te doping contents can reach current efficiencies of 4 cd/A, 8 cd/A and 11.8 cd/A respectively. The EQEs of the top emitting blue QLED devices corresponding to three types of blue quantum dot light-emitting layers with different Te doping contents also increase gradually.

Figure 5:
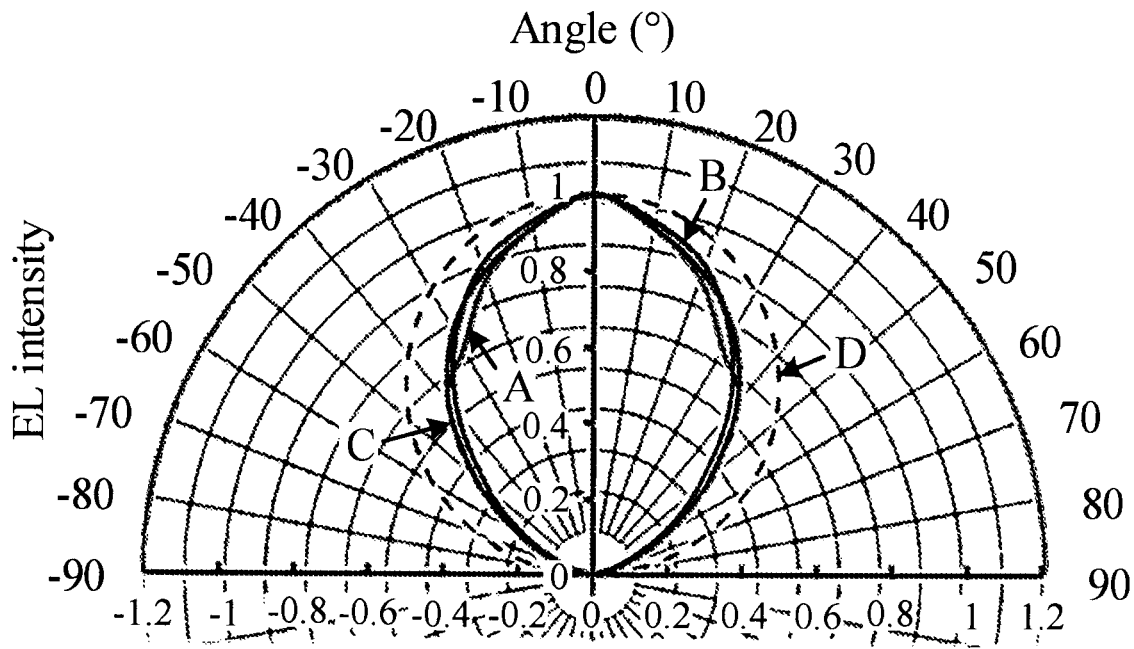
FIG. 5 is a distribution diagram of light emission angles corresponding to three types of top emitting blue QLED devices corresponding to three types of blue quantum dot light-emitting layers with different Te doping contents.

As shown in FIG. 5, FIG. 5 is a distribution diagram of light emission angles corresponding to three types of top emitting blue QLED devices corresponding to three types of blue quantum dot light-emitting layers with different Te doping contents. A corresponds to a distribution diagram of light emission angles of the device when x=0.03 to 0.04, B corresponds to a distribution diagram of light emission angles of the device when x=0.05 to 0.06, C corresponds to a distribution diagram of light emission angles of the device when x=0.06 to 0.07, and the dashed line D represents an ideal distribution diagram of light emission angles. It can be seen that the normalized EL intensity distribution presents a state of top enhancement, and there is almost no difference in the distribution shape of the light emission angles, indicating that there is no difference in the optical coupling efficiency of the devices corresponding to three types of blue quantum dot light-emitting layers with different Te doping contents.

The expression of the EQE of the device is $\eta EQE=\gamma \eta_{re} \times \eta_{out}$, where $\gamma$, $\eta_{re}$ and $\eta_{out}$ represent carrier balance, radiative recombination ratio and optical coupling efficiency of the device respectively. From above experimental results, there is no difference in the optical coupling efficiency of three types of blue QLED devices with different Te doping contents and the radiative recombination ratio of the quantum dot material itself (there is little difference in the photoluminescence quantum efficiency of three types of blue quantum dot light-emitting layers with different Te doping contents), so the main reason for the EQE change of the blue QLED device is the imbalance of the carriers in the device. From the perspective of the energy band of quantum dots: for three types of blue quantum dot light-emitting layers with different Te doping contents, the valence band of the blue quantum dot light-emitting layer gradually becomes shallower with the increase of Te doping content, so that the energy band barrier between the blue quantum dot light-emitting layer and the hole transport layer becomes smaller, and the hole injection is enhanced, so the carriers in the device are more balanced, and finally the EQE of the device is improved.

Figure 6:
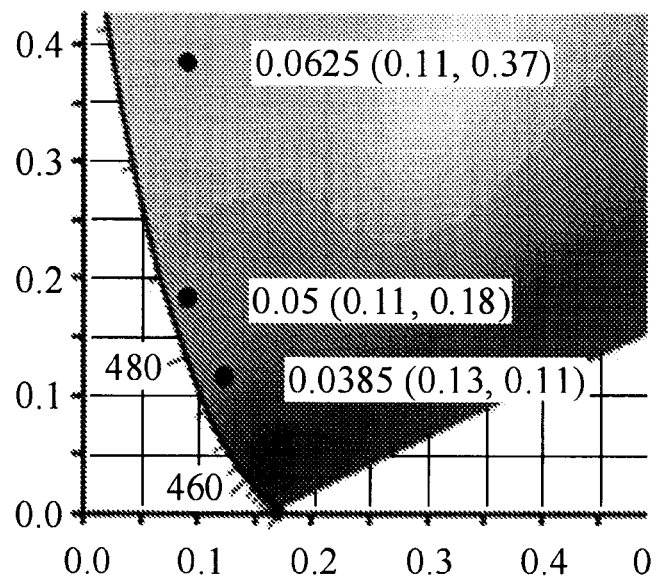
FIG. 6 is a schematic diagram of color coordinates corresponding to three types of blue top emitting quantum dot light-emitting devices with different Te doping contents before optimizing chromaticity efficiency of blue QLED devices.

As shown in FIG. 6, FIG. 6 is a schematic diagram of color coordinates corresponding to three types of blue top emitting quantum dot light-emitting devices with different Te doping contents before optimizing the chromaticity efficiency of the blue QLED devices, where the color coordinates of the device are (0.13, 0.11) when x=0.03 to 0.04, the color coordinates of the device are (0.11, 0.18) when x=0.05 to 0.06, and the color coordinates of the device are (0.11, 0.37) when x=0.06 to 0.07. Through calculation, the chromaticity efficiency of the device is 36.2 when x=0.03 to 0.04, the chromaticity efficiency of the device is 42.7 when x=0.05 to 0.06, and the chromaticity efficiency of the device is 31.9 when x=0.06 to 0.07. These chromaticity efficiency values are not high compared with the reported chromaticity efficiency of the blue QLED device with the quantum dot material being ZnSe, so the blue QLED device needs to be further optimized to improve the chromaticity efficiency.

Figure 7A:
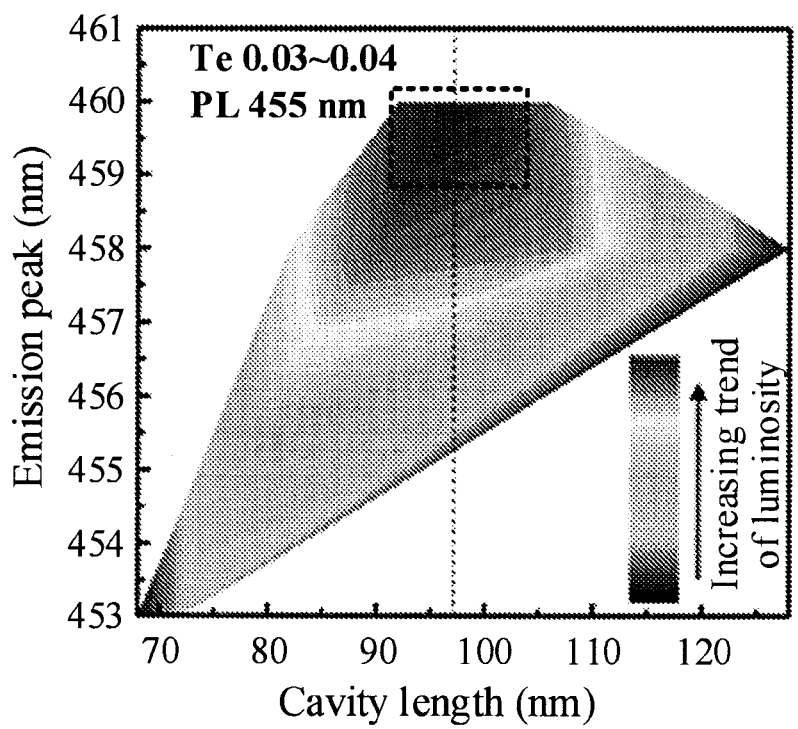
FIG. 7A is a performance result of the blue quantum dot (ZnSeTe-BQD-1) light-emitting layer in the top emitting blue QLED device when the Te doping content x=0.03 to 0.04.
Figure 7B:
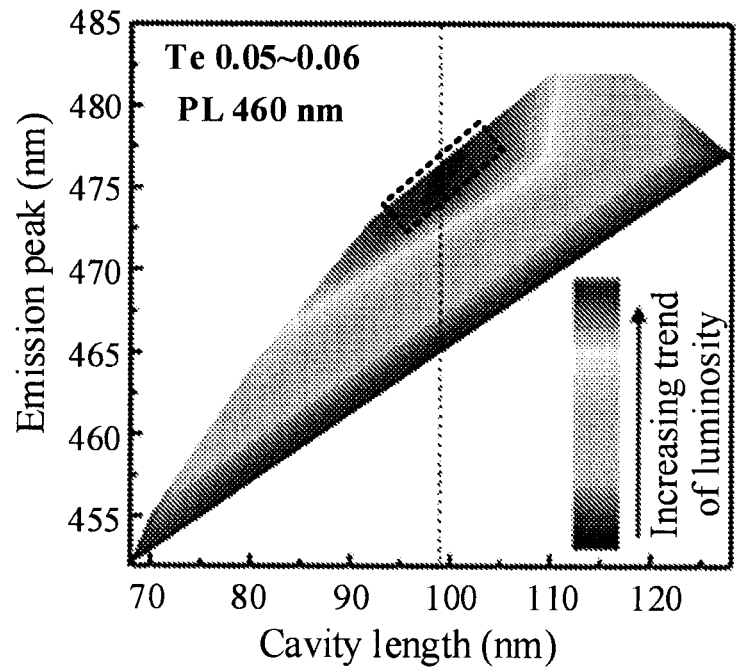
FIG. 7B is a performance result of the blue quantum dot (ZnSeTe-BQD-2) light-emitting layer in the top emitting blue QLED device when the Te doping content x=0.05 to 0.06.
Figure 7C:
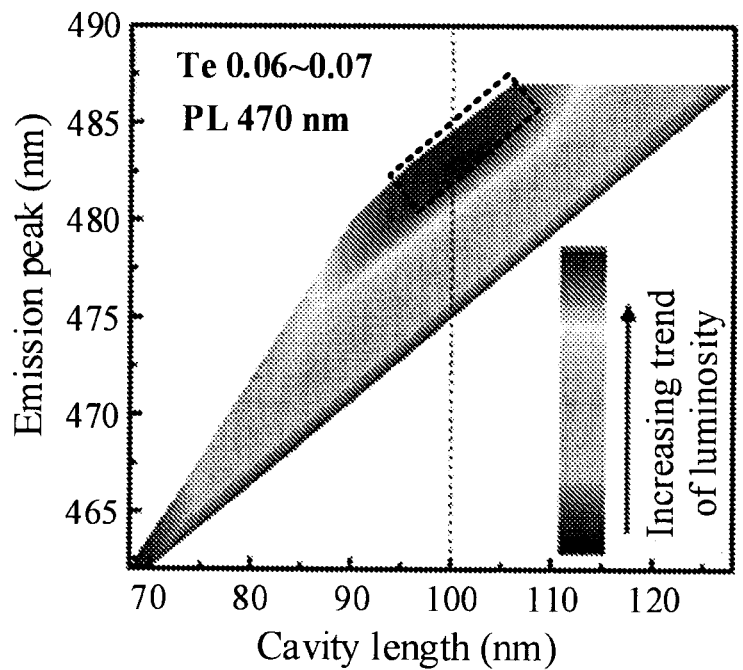
FIG. 7C is a performance result of the blue quantum dot (ZnSeTe-BQD-3) light-emitting layer in the top emitting blue QLED device when the Te doping content x=0.06 to 0.07.

The above-mentioned three types of blue quantum dot light-emitting layers with different Te doping contents have PL luminescence peaks of about 455 nm, 460 nm and 470 nm, respectively. In order to further optimize the chromaticity efficiency of the device, the performance of the above-mentioned three types of blue quantum dot light-emitting layers with different Te doping contents in the top emitting blue QLED device is simulated, as shown in FIGS. 7A-7C. FIG. 7A is a performance result of the blue quantum dot light-emitting layer in the top emitting blue QLED device when the Te doping content x=0.03 to 0.04, FIG. 7B is a performance result of the blue quantum dot light-emitting layer in the top emitting blue QLED device when the Te doping content x=0.05 to 0.06, and FIG. 7C is a performance result of the blue quantum dot light-emitting layer in the top emitting blue QLED device when the Te doping content x=0.06 to 0.07, where the dashed lines in FIGS. 7A-7C represent cavity lengths corresponding to maximum emission intensities. As can be seen from the simulation results, when the Te doping content x=0.03 to 0.04, the luminescence peak of the photoluminescence spectrum (PL) corresponding to the maximum luminous intensity of the blue quantum dot light-emitting layer is about 455 nm, and the luminescence peak of the electroluminescence spectrum (EL) corresponding to the maximum luminous intensity of the blue QLED device is about 460 nm, where the EL luminescence peak is red-shifted by 5 nm compared with the PL luminescence peak; when the Te doping content x=0.05 to 0.06, the luminescence peak of the photoluminescence spectrum (PL) corresponding to the maximum luminous intensity of the blue quantum dot light-emitting layer is about 460 nm, and the luminescence peak of the electroluminescence spectrum (EL) corresponding to the maximum luminous intensity of the blue QLED device is about 475 nm, where the EL luminescence peak is red-shifted by 15 nm compared with the PL luminescence peak; when the Te doping content x=0.06 to 0.07, the luminescence peak of the photoluminescence spectrum (PL) corresponding to the maximum luminous intensity of the blue quantum dot light-emitting layer is about 470 nm, and the luminescence peak of the electroluminescence spectrum (EL) corresponding to the maximum luminous intensity of the blue QLED device is about 485 nm, where the EL luminescence peak is red-shifted by 15 nm compared with the PL luminescence peak. Therefore, the devices corresponding to blue quantum dot light-emitting layers with PL luminescence peaks of 460 nm and 470 nm have higher CIEy values, so the blue quantum dot light-emitting layer with the least Te doping content (x=0.03 to 0.04) is selected to be applied in the blue QLED device to further optimize the chromaticity efficiency of the blue QLED device.

Optionally, as shown in FIG. 1, in order to improve the carrier balance, the blue top emitting quantum dot light-emitting device further includes a hole injection layer 6 between the hole transport layer 5 and the anode 2. A thickness of the hole injection layer 6 may be 20 nm to 24 nm, and optionally, the thickness of the hole injection layer 6 is 22 nm.

Optionally, as shown in FIG. 1, a thickness of the blue quantum dot light-emitting layer 3 may be 8 nm to 12 nm, and optionally, the thickness of the blue quantum dot light-emitting layer 3 is 10 nm.

Optionally, as shown in FIG. 1, the anode 2 may include a transparent conductive layer, a metal layer and a transparent conductive layer stacked, where a material of the metal layer includes but not limited to Ag, and a thickness of the metal layer may be 80 nm to 120 nm, and optionally, the thickness of the metal layer is 100 nm; a material of the transparent conductive layer includes but not limited to Indium Tin Oxide (ITO), and a thickness of the transparent conductive layer may be 8 nm to 12 nm, and optionally, the thickness of the transparent conductive layer is 10 nm.

Optionally, as shown in FIG. 1, a material of the cathode 1 includes but is not limited to Mg/Ag alloy, and a thickness of the cathode 1 may be 8 nm to 12 nm, and optionally, the thickness of the cathode 1 is 10 nm.

Optionally, as shown in FIG. 1, in order to improve the luminous efficiency of the device, the blue top emitting quantum dot light-emitting device further includes a light extraction layer 7 located on a side of the cathode 1 away from the blue quantum dot light-emitting layer 3, where a material of the light extraction layer 7 may be an organic material, and a thickness of the light extraction layer 7 may be 60 nm to 80 nm, and optionally, the thickness of the light extraction layer 7 is 70 nm.

The quantum dot light-emitting device may be an upright structure or an inverted structure. The difference between the two structures is that the film layers are fabricated in different orders. The upright structure is to form an anode, a hole injection layer, a hole transport layer, a quantum dot light-emitting layer, an electron transport layer and a cathode in sequence on a substrate; and the inverted structure is to form a cathode, an electron transport layer, a quantum dot light-emitting layer, a hole transport layer, a hole injection layer and an anode in sequence on a substrate.

Optionally, as shown in FIG. 1, the blue top emitting quantum dot light-emitting device provided by an embodiment of the disclosure is an upright structure. The blue top emitting quantum dot light-emitting device further includes a substrate 8 located on the side of the anode 2 away from the blue quantum dot light-emitting layer 3. The substrate 8 may be a glass substrate or a flexible substrate (such as PI, etc.), or may be other materials. The substrate includes a base substrate, a driving circuit between the base substrate and the anode, and a passivation layer and a flat layer between the driving circuit and the anode, and other structures.

Optionally, a material of the electron transport layer may include an oxide including Zn, such as ZnMgO.

Optionally, a material of the hole transport layer may be an organic material or an inorganic material. When the material of the hole transport layer is an organic material, the organic material includes but not limited to: polyvinyl carbazole (PVK); poly(9,9-dioctylfluorene-alt-N-(4-sec-butylphenyl)-diphenylamine) (TFB); N,N'-diphenyl-N,N'-bis(3-methylbenzene)-(1,1'-biphenyl)-4,4'-diamine (TPD); 4,4',4''-tris(carbazol-9-yl) triphenylamine (TCTA); or N,N'-diphenyl-N,N'-bis(1-naphthyl)-1,1'-biphenyl-4-4'-diamine (NPB). When the material of the hole transport layer is an inorganic material, the inorganic material includes but not limited to NiOx or VOx.

Optionally, a material of the hole injection layer includes but not limited to any one of PEDOT:PSS, MoOx, NiOx, or CuOx.

In the following, Ag/ITO represents the anode, HI represents the hole injection layer, HT represents the hole transport layer, ZnSeTe-BQD-1 represents the blue quantum dot light-emitting layer with Te doping content x of 0.03 to 0.04, ZnMgO represents the electron transport layer, Mg:Ag represents the cathode, and CPL represents the light extraction layer. The optical performance and electrical performance of the blue top emitting quantum dot light-emitting device provided by embodiments of the disclosure are optimized as follows.

Figure 8:
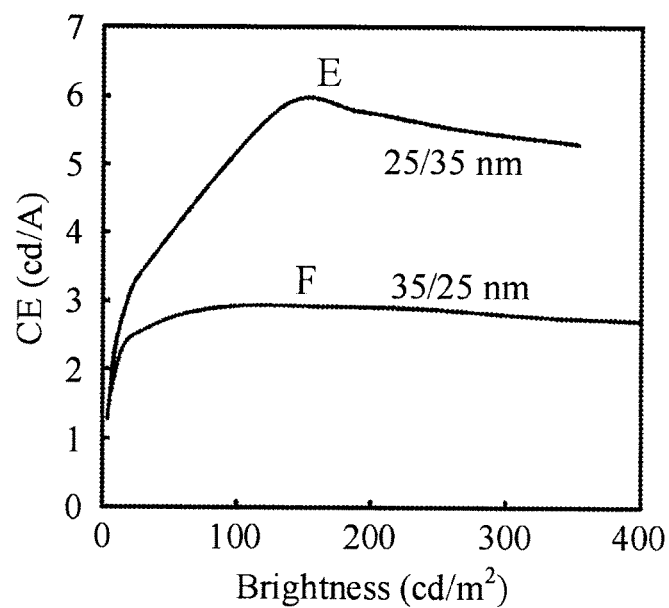
FIG. 8 is a schematic diagram of current efficiency of the ZnSeTe-BQD-1 top emitting blue QLED device with different HT/ET thickness ratios.
Figure 9:
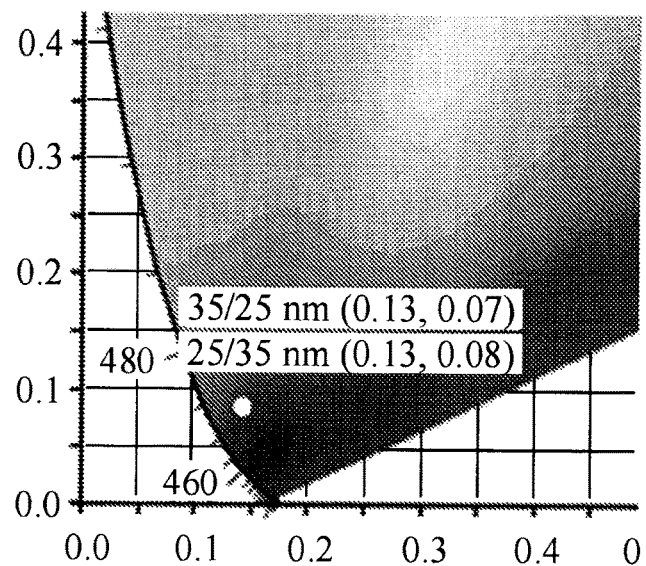
FIG. 9 is a schematic diagram of color coordinates corresponding to the ZnSeTe-BQD-1 top emitting blue QLED device with different HT/ET thickness ratios.

Firstly, through the optical simulation, for the blue quantum dot light-emitting layer (represented by ZnSeTe-BQD-1) with Te doping content x of 0.03 to 0.04, the obtained device structure with the optimal optical performance is Ag (100 nm)/ITO (8 nm)/HI (22 nm)/HT (10 nm)/ZnSeTe-BQD-1 (10 nm)/ZnMgO (48 nm)/Mg:Ag (10 nm)/CPL (70 nm). Under this structure, when the thickness of the hole transport layer is 10 nm and the thickness of the electron transport layer is 48 nm, the optical performance of the blue QLED device is optimal, that is, the red shift of the EL luminescence peak relative to the PL luminescence peak is the smallest, and the luminous intensity of the device is the strongest. The optimal CIEy value can be obtained under this condition. However, the chromaticity efficiency of the device is not only related to the CIEy value, but also related to the Current Efficiency (CE) of the device, so the electrical balance of the device needs to be improved in the case of optimizing the optical performance. Since the conductivity of the hole injection layer is relatively high, the thickness of the hole injection layer has little effect on the electrical performance of the entire device. Thus, we believe that the thicknesses of the hole transport layer (represented by HT) and the electron transport layer (represented by ET) are the key to regulate the electrical balance of the device. In this regard, we ensure that the cavity length of the device (the distance between the cathode and the anode) is constant, and only the thickness ratio of HT to ET is adjusted to adjust the electrical balance of the device. We prepared two device structures in which the thicknesses of HT and ET are 35 nm/25 nm and 25 nm/35 nm respectively, and the total thickness of HT and ET is 60 nm and remains unchanged, but the thickness ratio is changed to regulate the electrical balance of the device. As shown in FIG. 8 and FIG. 9, FIG. 8 is a schematic diagram of the current efficiency of the ZnSeTe-BQD-1 top emitting blue QLED device with different HT/ET thickness ratios, where the curve E represents the case where the thicknesses of HT and ET are 25 nm/35 nm respectively, and the curve F represents the case where the thicknesses of HT and ET are 35 nm/25 nm respectively. FIG. 9 is a schematic diagram of the corresponding color coordinates. As can be seen, when the thickness of the hole transport layer (HT) is 25 nm and the thickness of the electron transport layer (ET) is 35 nm, the current efficiency of the device is the largest (5.8 cd/A). At this time, the CIEy coordinate of the device is 0.08, and the chromaticity efficiency is 72.5, which has increased by 50% compared with the above-mentioned chromaticity efficiency value (36.2) shown in FIG. 6 before the device structure is optimized. Moreover, the chromaticity efficiency value of 72.5 is also higher than the chromaticity efficiency values of most ZnSe-based blue QLED devices reported so far, so the blue top emitting quantum dot light-emitting device provided by embodiments of the disclosure can greatly improve the chromaticity efficiency of the device.

Therefore, when the Te doping content x is 0.03 to 0.04, that is, the blue quantum dot light-emitting layer has a PL luminescence peak of about 455 nm, and when the thickness of the hole transport layer 5 is smaller than the thickness of the electron transport layer 4, the electrical performance of the blue top emitting quantum dot light-emitting device is better. Optionally, the structure of the top emitting blue QLED device corresponding to the optimal electrical performance is Ag (100 nm)/ITO (8 nm)/HI (22 nm)/HT (25 nm)/ZnSeTe-BQD-1 (10 nm)/ZnMgO (35 nm)/Mg:Ag (10 nm)/CPL (70 nm). That is, for the blue quantum dot light-emitting layer with Te doping content x of 0.03 to 0.04, when the corresponding cavity length of the top emitting blue QLED device (the distance between the cathode 1 and anode 2, that is, the sum of the thicknesses of the hole injection layer 6, the hole transport layer 5, the blue quantum dot light-emitting layer 3 and the electron transport layer 4) is in the range of 90 nm to 100 nm, the optical performance and electrical performance of the device are optimal. As shown in FIG. 7A, the dotted line box in FIG. 7A represents the cavity length range corresponding to the relatively large luminous intensity.

As shown in FIG. 7B and FIG. 7C, it can be seen that the device cavity lengths corresponding to the optimal optical performance for the top emitting blue QLED device with Te doping content of 0.05 to 0.06 and the top emitting blue QLED device with Te doping content of 0.06 to 0.07 increase gradually. That is, for the top emitting blue QLED device, when the Te doping amount in the blue quantum dot light-emitting layer is larger, that is, the blue quantum dot light-emitting layer has a PL luminescence peak red-shifted more, the device cavity length corresponding to the optimal optical performance will also increase, that is, the device can achieve the optimal optical performance only when the functional layers (HI, HT, QDs, ET) are thicker. Therefore, for the blue quantum dot light-emitting layer with Te doping content of 0.05 to 0.06, when the cavity length (the distance between the cathode and anode) of the corresponding top emitting blue QLED device is 95 nm to 105 nm, the optical performance and electrical performance of the device are optimal; and for the blue quantum dot light-emitting layer with Te doping content of 0.06 to 0.07, when the cavity length (the distance between the cathode and anode) of the corresponding top emitting blue QLED device is 95 nm to 110 nm, the optical performance and electrical performance of the device are optimal. As shown in FIG. 7B and FIG. 7C, the dotted line boxes in FIG. 7B and FIG. 7C represent the cavity length ranges corresponding to the relatively large luminous intensities.

To sum up, the blue top emitting quantum dot light-emitting device provided by embodiments of the disclosure can optimize the optical performance of the device (the CIEy value is smaller and the luminous intensity is higher) and adjust the thickness ratio of the hole transport layer to the electron transport layer under the condition that the cavity length remains unchanged, and can ensure the optimized color coordinates and current efficiency, so that the final chromaticity efficiency of the device can reach 72, exceeding most levels reported in industry.

Based on the same inventive concept, an embodiment of the disclosure further provides a display apparatus, including a red quantum dot light-emitting device, a green quantum dot light-emitting device, and a blue top emitting quantum dot light-emitting device which is the above-mentioned blue top emitting quantum dot light-emitting device provided by embodiments of the disclosure.

In a specific implementation, the structures of the red quantum dot light-emitting device, the green quantum dot light-emitting device and the blue top emitting quantum dot light-emitting device may be the same, for example, the red quantum dot light-emitting device, the green quantum dot light-emitting device and the blue top emitting quantum dot light-emitting device in the display apparatus are all upright top emitting devices.

In a specific implementation, the above-mentioned display apparatus according to an embodiment of the disclosure may also include other film layers well known to those skilled in the art, which will not be described in detail here.

The display apparatus may be: a mobile phone, a tablet, a television, a display, a laptop, a digital photo frame, a navigator, or any other product or component with display function. All of other indispensable components of the display apparatus should be understood by those ordinary skilled in the art to be included, and will be omitted here and should not be considered as limitations on the invention. The principle of the display apparatus to solve the problem is similar to that of the above-mentioned blue top emitting quantum dot light-emitting device, so implementations of the display apparatus can refer to implementations of the above-mentioned blue top emitting quantum dot light-emitting device, and the detailed description thereof will be omitted.

In the above-mentioned blue top emitting quantum dot light-emitting device and display apparatus provided by embodiments of the disclosure, Te (tellurium) with molar content of 0.03 to 0.07 is doped in ZnSe (core) of the blue quantum dot material made of ZnSe/ZnSe/ZnS (core/shell/shell), and the thickness of the hole transport layer is set to 10 nm to 35 nm, the thickness of the electron transport layer is set to 25 nm to 50 nm, and the sum of the thicknesses of the hole transport layer and the electron transport layer is set to 55 nm to 65 nm, so that the optical performance and electrical performance of the blue top emitting quantum dot light-emitting device can be optimal, and the finally obtained chromaticity efficiency of the blue top emitting quantum dot light-emitting device can reach 72.5, improving the device performance of the blue top emitting quantum dot light-emitting device effectively.

Although embodiments of the disclosure have been described, those skilled in the art can make additional alterations and modifications to these embodiments once they learn about the basic creative concepts. Thus, the attached claims are intended to be interpreted to include embodiments as well as all the alterations and modifications falling within the scope of the disclosure.

Evidently, those skilled in the art can make various modifications and variations to embodiments of the disclosure without departing from the spirit and scope of embodiments of the disclosure. Thus, the disclosure is also intended to encompass these modifications and variations to embodiments of the disclosure as long as these modifications and variations come into the scope of the claims of the disclosure and their equivalents.

What is claimed is:

1. A blue top emitting quantum dot light-emitting device, comprising: a cathode and an anode oppositely arranged, a blue quantum dot light-emitting layer between the cathode and the anode, an electron transport layer between the cathode and the blue quantum dot light-emitting layer, and a hole transport layer between the blue quantum dot light-emitting layer and the anode; wherein:
   a material of the blue quantum dot light-emitting layer is $ZnSe_{1-x}:Te_x/ZnSe/ZnS$, wherein $ZnSe_{1-x}:Te_x$ means that a molar ratio of Se to Te is 1-x:x, and x is 0.03 to 0.07;
   a thickness of the hole transport layer is 10 nm to 35 nm, a thickness of the electron transport layer is 25 nm to 50 nm, and a sum of thicknesses of the hole transport layer and the electron transport layer is 55 nm to 65 nm.

2. The blue top emitting quantum dot light-emitting device according to claim 1, wherein x=0.03 to 0.04, and the thickness of the hole transport layer is less than the thickness of the electron transport layer.

3. The blue top emitting quantum dot light-emitting device according to claim 2, wherein a luminescence peak of a photoluminescence spectrum corresponding to a maximum luminous intensity of the blue quantum dot light-emitting layer is 455 nm, and a luminescence peak of an electroluminescence spectrum corresponding to a maximum luminous intensity of the blue top emitting quantum dot light-emitting device is 460 nm.

4. The blue top emitting quantum dot light-emitting device according to claim 3, wherein the thickness of the hole transport layer is 10 nm, and the thickness of the electron transport layer is 48 nm.

5. The blue top emitting quantum dot light-emitting device according to claim 3, wherein the thickness of the hole transport layer is 25 nm, and the thickness of the electron transport layer is 35 nm.

6. The blue top emitting quantum dot light-emitting device according to claim 4, further comprising a hole injection layer between the hole transport layer and the anode, wherein a distance between the cathode and the anode is 90 nm to 100 nm.

7. The blue top emitting quantum dot light-emitting device according to claim 3, wherein the blue quantum dot light-emitting layer has a valence band position of −6.8 eV to −6.9 eV and a conduction band position of −3.8 eV to −3.9 eV.

8. The blue top emitting quantum dot light-emitting device according to claim 1, wherein x=0.05 to 0.06, a luminescence peak of a photoluminescence spectrum corresponding to a maximum luminous intensity of the blue quantum dot light-emitting layer is 460 nm, and a luminescence peak of an electroluminescence spectrum corresponding to a maximum luminous intensity of the blue top emitting quantum dot light-emitting device is 475 nm.

9. The blue top emitting quantum dot light-emitting device according to claim 8, further comprising a hole injection layer between the hole transport layer and the anode, wherein a distance between the cathode and the anode is 95 nm to 105 nm.

10. The blue top emitting quantum dot light-emitting device according to claim 8, wherein the blue quantum dot light-emitting layer has a valence band position of −6.5 eV to −6.6 eV and a conduction band position of −3.7 eV to −3.8 eV.

11. The blue top emitting quantum dot light-emitting device according to claim 1, wherein x=0.06 to 0.07, a luminescence peak of a photoluminescence spectrum corresponding to a maximum luminous intensity of the blue quantum dot light-emitting layer is 470 nm, and a luminescence peak of an electroluminescence spectrum corresponding to a maximum luminous intensity of the blue top emitting quantum dot light-emitting device is 485 nm.

12. The blue top emitting quantum dot light-emitting device according to claim 11, further comprising a hole injection layer between the hole transport layer and the anode, wherein a distance between the cathode and the anode is 95 nm to 110 nm.

13. The blue top emitting quantum dot light-emitting device according to claim 11, wherein the blue quantum dot light-emitting layer has a valence band position of −6.4 eV to −6.5 eV and a conduction band position of −3.6 eV to −3.7 eV.

14. The blue top emitting quantum dot light-emitting device claim 6, wherein a thickness of the hole injection layer is 20 nm to 24 nm, and a thickness of the blue quantum dot light-emitting layer is 8 nm to 12 nm.

15. The blue top emitting quantum dot light-emitting device according to claim 14, wherein the thickness of the hole injection layer is 22 nm, and the thickness of the blue quantum dot light-emitting layer is 10 nm.

16. The blue top emitting quantum dot light-emitting device according to claim 1, wherein the hole transport layer has a valence band position of −5.8 eV and a conduction band position of −2.9 eV; and the electron transport layer has a valence band position of −7.36 eV and a conduction band position of −3.86 eV.

17. The blue top emitting quantum dot light-emitting device according to claim 1, wherein the anode comprises a transparent conductive layer, a metal layer and a transparent conductive layer stacked, a material of the metal layer comprises Ag, a thickness of the metal layer is 80 nm to 120 nm, a material of the transparent conductive layer comprises indium tin oxide, and a thickness of the transparent conductive layer is 8 nm to 12 nm.

18. The blue top emitting quantum dot light-emitting device according to claim 1, wherein a material of the cathode comprises Mg/Ag alloy, and a thickness of the cathode is 8 nm to 12 nm.

19. The blue top emitting quantum dot light-emitting device according to claim 1, wherein the blue top emitting quantum dot light-emitting device is an upright structure.

20. A display apparatus, comprising a red quantum dot light-emitting device, a green quantum dot light-emitting device, and a blue top emitting quantum dot light-emitting device according to claim 1.

* * * * *